United States Patent [19]

Ponjee et al.

[11] Patent Number: 4,985,370

[45] Date of Patent: Jan. 15, 1991

[54] METHOD OF MANUFACTURING SEMICONDUCTOR LASER DEVICE

[75] Inventors: Johannes J. Ponjee; Rudolf P. Tijburg, both of Eindhoven, Netherlands

[73] Assignee: U.S. Philips Corporation, New York, N.Y.

[21] Appl. No.: 452,876

[22] Filed: Dec. 13, 1989

Related U.S. Application Data

[62] Division of Ser. No. 174,743, Mar. 29, 1988, Pat. No. 4,905,245.

[30] Foreign Application Priority Data

Apr. 16, 1987 [NL] Netherlands ............... 8700904

[51] Int. Cl.$^5$ ............................................. H01L 21/20
[52] U.S. Cl. ......................... 437/129; 148/DIG. 95; 148/DIG. 125; 437/235; 437/946; 437/980
[58] Field of Search .................. 148/DIG. 15, 17, 43, 148/56, 65, 72, 95, 110, 119, 125, 169, 33-33.6; 156/610-614; 357/16, 17, 52, 54; 372/43, 45, 49, 50; 437/10, 12, 81, 85, 105, 107, 126, 129, 133, 225, 235, 247, 939, 946, 980

[56] References Cited

U.S. PATENT DOCUMENTS

| | | | |
|---|---|---|---|
| 4,046,457 | 9/1977 | Land et al. ...................... | 350/164 |
| 4,047,804 | 9/1977 | Stephens ........................ | 350/164 |
| 4,178,564 | 12/1979 | Ladany et al. .................. | 372/49 |
| 4,560,634 | 12/1985 | Matsuo et al. .................. | 430/84 |
| 4,563,368 | 1/1986 | Tihanyi et al. ................. | 437/129 |
| 4,653,059 | 3/1987 | Akiba et al. .................... | 372/49 |
| 4,713,314 | 12/1987 | Namba et al. ................... | 430/338 |
| 4,751,708 | 6/1988 | Jackson et al. ................. | 372/49 |
| 4,753,516 | 6/1988 | Doi et al. ...................... | 350/164 |
| 4,766,470 | 8/1988 | Scholl et al. ................... | 372/49 |
| 4,796,981 | 1/1989 | Nishimura et al. .............. | 350/353 |
| 4,868,076 | 9/1989 | Iino et al. ...................... | 430/58 |
| 4,932,859 | 6/1990 | Yagi et al. ...................... | 430/66 |
| 4,939,054 | 7/1990 | Hotomi et al. .................. | 430/58 |

FOREIGN PATENT DOCUMENTS

| | | |
|---|---|---|
| 0194835 | 9/1986 | European Pat. Off. |
| 1183181 | 7/1989 | Japan . |
| 1248682 | 10/1989 | Japan . |

OTHER PUBLICATIONS

Nash et al., "GaAs Laser Reliability and Protective Facet Coatings", J. Appl. Phys. 50(5), May 1979, pp. 3121-32.

Fye, ". . . Selection of Diode Laser Facet Coatings", IEEE J. Quantum Electron., QE17(19), 1981, pp. 1950-4.

Primary Examiner—Olik Chaudhuri
Assistant Examiner—William Bunch
Attorney, Agent, or Firm—Paul R. Miller

[57] ABSTRACT

The invention relates a method of manufacturing a semiconductor laser device having a coating on surfaces of a semiconductor body intended for emanation of a laser beam.

2 Claims, 1 Drawing Sheet

METHOD OF MANUFACTURING SEMICONDUCTOR LASER DEVICE

This application is a divisional application of previous parent application Ser. No. 07/174,743, filed Mar. 29, 1988, now U.S. Pat. No. 4,905,245 and all benefits of such earlier application are hereby claimed for this new divisional application.

The invention relates to a semiconductor laser device having a coating on surfaces of a semiconductor body intended for emanation of a laser beam and to a method of manufacturing such a semiconductor laser device.

BACKGROUND OF THE INVENTION

A semiconductor laser device of the kind mentioned in the opening paragraph is known, for example, from J.Appl. Phys 50 (5), 3122–3132 (May 1979). In this publication, an aluminum oxide layer is used as coating. The fun of the aluminum oxide layer is inter alia to provide for protection at the area of the emanation of the laser beam against attack of the emanation surfaces under the influence of water vapor present.

Presumably, however, water vapor is not the only cause of problems at the emanation surface and oil present during the different operations may also play a part with an aluminum oxide layer as coating, for example, due to the fact that the oil at the surface of the aluminum oxide layer is decomposed and scatters the emanating laser beam.

SUMMARY OF THE INVENTION

The present invention has inter alia for its object to avoid the problems described at least to a considerable extent.

The invention is based inter alia on the recognition of the fact that with another type of protection, problems at the emanation surfaces can be avoided over a wide range of impurities.

According to the invention, the semiconductor laser device mentioned in the opening paragraph is therefore characterized in that the coating comprises a layer of an alkyl compound obtained by conversion of groups at the surfaces with a compound chosen from the group comprising silanes, which are substituted with at least one alkyl group which may be substituted with at least one fluorine atom, and carbonic acids with an alkyl group having at least 7 carbon atoms. Groups at the surfaces participating in the conversion are, for example, hydroxyl groups. Such coatings provide for a very satisfactory protection of the emanation surface against contamination by water and oil.

In a preferred embodiment of the semiconductor laser device according to the invention, the surfaces intended for emanation of the laser beam are successively coated with a layer of a transparent dielectric material having a refractive index in the range of 1.3 to 2.5 and the layer of the alkyl compound. The dielectric materials provide the desired optical properties for the emanation surface. Preferably, the transparent dielectric material is aluminum oxide or silicon nitride.

Preferably, the silane is 1-(heptadecafluoro-1,1,2,2-tetrahydrodecyl)-dimethylchlorosilane or 1-(heptadecafluoro-1,1,2,2-tetrahydrodecyl)-triethoxy silane and the alkanecarboxylic acid is stearic acid.

The invention also relates to a method of manufacturing the semiconductor laser device according to the invention. In order to improve the conversion, the surfaces on which the layer of the alkyl compound is formed are subjected to a cleaning operation.

Very favorable results are then obtained if the cleaning treatment used is a treatment with ozone under irradiation with ultraviolet radiation.

A very favorable step of applying the compound consists in that the cleaned surface is wetted with a solution of the compound, for example the carboxylic acid. If the vapor tension of the compound is sufficiently high, for example of the silane, the alkyl compound can be formed when the semiconductor body is situated in the vapor of the silane or of a solution of the silane boiling under reflux.

DESCRIPTION OF PREFERRED EMBODIMENTS

Figure 1:
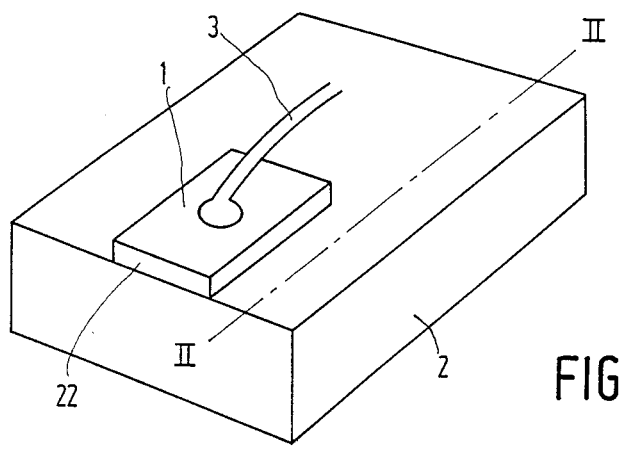
FIG. 1 shows diagrammatically and in elevation a part of the present semiconductor laser device.
Figure 2:
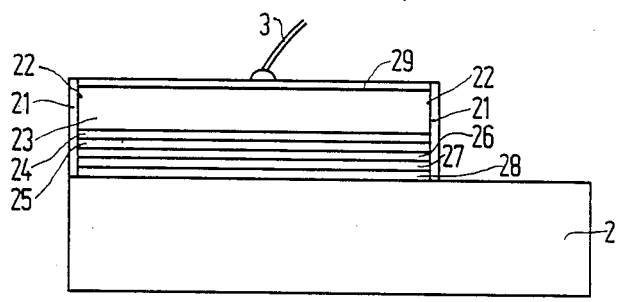
FIG. 2 is a sectional view taken on the line II—II in FIG. 1 of a semiconductor laser device according to the prior art.

The present semiconductor laser device (cf. FIGS. 1 and 2) has a coating 21 on surfaces 22 of a semiconductor body 1 intended for emanation of a laser beam. The semiconductor body 1 is soldered on a copper body 2 serving for the dissipation of heat developed during operation of the semiconductor laser device. Reference numeral 3 denotes a second connection of the semiconductor laser device.

Figure 3:
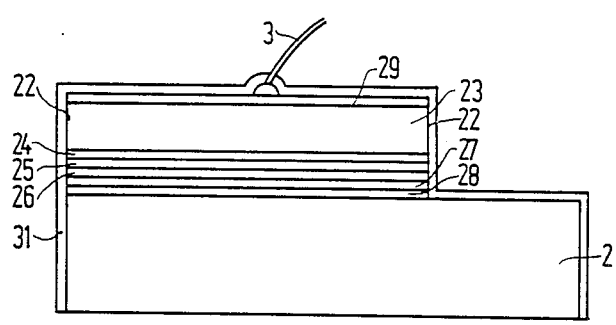
FIG. 3 is a sectional view taken on the line II—II in FIG. 1 of a first embodiment of the semiconductor laser device according to the invention.
Figure 4:
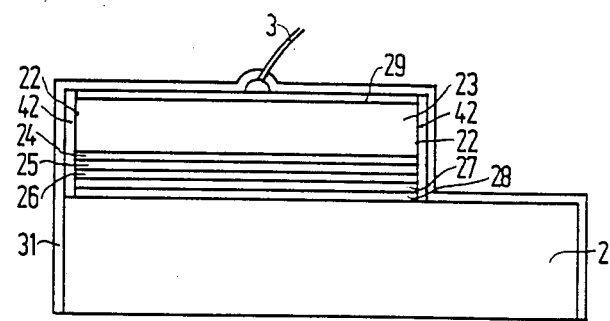
FIG. 4 is a sectional view taken on the line II—II in FIG. 1 of a second embodiment of the semiconductor laser device according to the invention.

In order to avoid problems with usual coatings 21, for example of aluminum oxide, due to the presence of, for example, oil, which is decomposed on the surface of the coating and causes the laser beam to change its shape and direction, according to the invention the coating comprises (cf. FIGS. 3 and 4) a layer 31 of an alkyl compound obtained by conversion of groups at the surfaces with a compound chosen from the group comprising silanes, which are substituted with at least one alkyl group which may be substituted with at least one fluorine atom, and carbonic acids with an alkyl group having at least seven carbon atoms.

In order to obtain very favorable optical properties, the surfaces 22 intended for emanation of the laser beam are successively provided with a layer 42 of a transparent dielectric material having a refractive index in the range of 1.3 to 2.5 and the layer 31 of the compound with the alkyl group.

As transparent dielectric material use is preferably made of aluminum oxide or silicon nitride.

The semiconductor laser device according to the invention comprises in a usual manner, for example, an n-type substrate 23 of GaAs, an n-type layer 24 of $Ga_{0.5}Al_{0.5}As$, an active layer 25 of $Ga_{0.85}Al_{0.15}As$, a p-type layer 26 of $Ga_{0.5}Al_{0.5}As$, a p-type layer 27 of GaAs and metal contact layers 28 and 29.

The dielectric layer 42 of aluminum oxide or silicon nitride, which is preferably present, may also be provided in a usual manner.

For forming the layer 31 of the compound at least comprising an alkyl group, a wide choice of compounds is possible.

Preferably, substituted silanes, such as 1-(heptadecafluoro-1,1,2,2-tetrahydrodecyl)-dimethyl chlorosilane or 1-(heptadecafluoro-1,1,2,2-tetrahydrodecyl)triethoxy silane, are used.

Alkane carboxylic acids, such as stearic acid, may also be used very satisfactorily as the compound.

Before the layer of the compounds is provided, a cleaning treatment is carried out, preferably a cleaning treatment in ozone. In this treatment, for example an ozone reactor is used of UVP Ltd. (Science Park, Milton Road, Cambridge, England). In such a treatment, silicon nitride surfaces are also activated for the subsequent conversion.

The compound may be applied by immersing the semiconductor body in a solution of a carbonic acid in toluene or by subjecting this body to a vapor of a silane. Preferably, the compound is applied by arranging the semiconductor body in vapor of a solution of, for example, 2% of the silane in toluene, this solution being boiled under reflux.

It has been found that the thickness of, for example, the layer of silane on the semiconductor body (and the aluminum oxide or silicon nitride layer, respectively) is extremely small: about 1 molecule of silane per $nm^2$ is present on the surfaces.

The layer of the compound 31 can be formed after the semiconductor body has been provided in a usual manner with a contact 3.

It will be appreciated that the invention is not limited to the embodiments described, but that many variations are possible for those skilled in the art without departing from the scope of the present invention.

As transparent dielectric material, use may also be made, for example, of silicon oxide or hafnium oxide.

As substrate 23 use may also be made of InP, while as active layer 25 use may also be made of InGaAsP or InGaAs.

Alkyl silanes other than the aforementioned perfluorinated alkyl silanes may also be used.

What is claimed is:

1. A method of manufacturing a semiconductor laser device comprising coating surfaces of a semiconductor body for emanating a laser beam with a layer of an alkyl compound obtained by conversion of groups at the surfaces with a compound chosen from the group comprising silanes, said silanes being substituted with at least one alkyl group, and said at least one alkyl group being substituted with at least one fluorine atom, and carbonic acids with an alkyl group having at least seven carbon atoms, characterized in that the surfaces on which the layer of the alkyl compound is formed are subjected to a cleaning treatment.

2. A method as claimed in claim 1, characterized in that as cleaning treatment a treatment with ozone is used under irradiation with ultraviolet radiation.

* * * * *